US008604995B2

(12) United States Patent
Hammad

(10) Patent No.: US 8,604,995 B2
(45) Date of Patent: Dec. 10, 2013

(54) SHIELDING OF PORTABLE CONSUMER DEVICE

(75) Inventor: Ayman Hammad, Pleasanton, CA (US)

(73) Assignee: Visa U.S.A. Inc., San Francisco, CA (US)

(*) Notice: Subject to any disclaimer, the term of this patent is extended or adjusted under 35 U.S.C. 154(b) by 450 days.

(21) Appl. No.: 11/811,875

(22) Filed: Jun. 11, 2007

(65) Prior Publication Data

US 2008/0303632 A1 Dec. 11, 2008

(51) Int. Cl.
*H01Q 1/24* (2006.01)
*H01Q 1/52* (2006.01)

(52) U.S. Cl.
USPC .................................... 343/841; 343/702

(58) Field of Classification Search
USPC ......... 343/702, 841; 340/572.1, 572.3, 572.8; 235/492
See application file for complete search history.

(56) References Cited

U.S. PATENT DOCUMENTS

| | | |
|---|---|---|
| 4,480,250 A | 10/1984 | McNeely |
| 5,051,724 A | 9/1991 | Morrow et al. |
| 5,090,563 A | 2/1992 | Becker |
| 5,090,583 A | 2/1992 | Becker |
| 5,275,285 A | 1/1994 | Clegg |
| 5,288,942 A | 2/1994 | Godfrey |
| 5,335,366 A | 8/1994 | Daniels |
| 5,465,206 A | 11/1995 | Hilt et al. |
| 5,477,038 A | 12/1995 | Levine et al. |
| 5,500,513 A | 3/1996 | Langhans et al. |
| 5,515,031 A | 5/1996 | Pereira et al. |
| 5,594,200 A | 1/1997 | Ramsey |
| 5,621,201 A | 4/1997 | Langhans et al. |
| 5,941,375 A | 8/1999 | Kamens et al. |
| 6,079,621 A | 6/2000 | Vardanyan et al. |
| 6,121,544 A * | 9/2000 | Petsinger ...................... 174/353 |
| 6,127,938 A | 10/2000 | Friedman |
| 6,247,129 B1 | 6/2001 | Keathley et al. |
| 6,359,216 B1 | 3/2002 | Liu |
| 6,375,780 B1 | 4/2002 | Tuttle et al. |
| 6,400,270 B1 | 6/2002 | Person |
| 6,457,647 B1 | 10/2002 | Kurihashi et al. |
| 6,502,135 B1 | 12/2002 | Munger et al. |
| 6,560,581 B1 | 5/2003 | Fox et al. |

(Continued)

FOREIGN PATENT DOCUMENTS

| | | |
|---|---|---|
| DE | 9015824 | 2/1991 |
| EP | 0 822 513 | 2/1998 |

(Continued)

OTHER PUBLICATIONS

International Preliminary Report on Patentability dated Dec. 23, 2009 from International Application No. PCT/US2008/065081, 6 pages.
European Search Report issued Mar. 10, 2010 from European Patent Application No. 08020393, 5 pages.
U.S. Appl. No. 11/998,168, filed Nov. 28, 2007.
U.S. Appl. No. 12/273,017, filed Nov. 18, 2008.
U.S. Appl. No. 12/332,990, filed Dec. 11, 2008.
Office Action dated Dec. 14, 2009 from U.S. Appl. No. 12/273,017, 10 pages.

(Continued)

*Primary Examiner* — Robert Karacsony
(74) *Attorney, Agent, or Firm* — Kilpatrick Townsend & Stockton LLP

(57) ABSTRACT

A portable consumer device is disclosed. An electromagnetic shield is provided in the portable consumer device that is capable of preventing communication between the portable consumer device and an interrogation device. The shield is movable between a distal position in which communication with the interrogation device is enabled and a proximate position in which the shield prevents the transmitting antenna from communicating with the interrogation device.

12 Claims, 7 Drawing Sheets

(56) References Cited

U.S. PATENT DOCUMENTS

| | | |
|---|---|---|
| 6,588,660 B1 | 7/2003 | Buescher et al. |
| 6,646,554 B1 | 11/2003 | Goff et al. |
| 6,759,736 B2 | 7/2004 | Bohmer et al. |
| 6,785,519 B2 | 8/2004 | Toyoda et al. |
| 6,826,616 B2 | 11/2004 | Larson et al. |
| 6,837,425 B2 | 1/2005 | Gauthier et al. |
| 6,845,863 B1 | 1/2005 | Riley |
| 6,859,831 B1 | 2/2005 | Gelvin et al. |
| 6,920,611 B1 | 7/2005 | Spaeth et al. |
| 6,970,070 B2 | 11/2005 | Juels et al. |
| 7,007,840 B2 | 3/2006 | Davis |
| 7,039,611 B2 | 5/2006 | Devine |
| 7,051,923 B2 | 5/2006 | Nguyen et al. |
| 7,081,865 B2 | 7/2006 | Wu et al. |
| 7,086,587 B2 | 8/2006 | Myllymaki |
| 7,104,446 B2 | 9/2006 | Bortolin et al. |
| 7,121,456 B2 | 10/2006 | Spaeth et al. |
| 7,124,937 B2 | 10/2006 | Myers et al. |
| 7,152,780 B2 | 12/2006 | Gauthier et al. |
| 7,187,959 B2 | 3/2007 | Leon et al. |
| 7,243,840 B2 | 7/2007 | Bason et al. |
| 7,243,853 B1 | 7/2007 | Levy et al. |
| 7,280,981 B2 | 10/2007 | Huang et al. |
| 7,482,925 B2 | 1/2009 | Hammad et al. |
| 7,571,752 B1 | 8/2009 | Donohoe |
| 7,635,089 B2 * | 12/2009 | Augustinowicz et al. ..... 235/486 |
| 7,659,606 B2 | 2/2010 | Klatt |
| 7,701,408 B2 * | 4/2010 | Bombay et al. ............. 343/841 |
| 7,784,684 B2 | 8/2010 | Labrou et al. |
| 2002/0031997 A1 | 3/2002 | Lawler, Jr. et al. |
| 2002/0046351 A1 | 4/2002 | Takemori et al. |
| 2002/0137473 A1 | 9/2002 | Jenkins |
| 2002/0158747 A1 | 10/2002 | McGregor et al. |
| 2003/0119459 A1 | 6/2003 | Carillo et al. |
| 2003/0233292 A1 | 12/2003 | Richey et al. |
| 2004/0019522 A1 | 1/2004 | Bortolin et al. |
| 2004/0044621 A1 | 3/2004 | Huang et al. |
| 2004/0050922 A1 | 3/2004 | Gauthier et al. |
| 2004/0054581 A1 | 3/2004 | Redford et al. |
| 2004/0054590 A1 | 3/2004 | Redford et al. |
| 2004/0054591 A1 | 3/2004 | Spaeth et al. |
| 2004/0117514 A1 | 6/2004 | Nelms et al. |
| 2004/0139021 A1 | 7/2004 | Reed et al. |
| 2004/0140896 A1 * | 7/2004 | Ohkawa et al. ............ 340/572.1 |
| 2004/0148224 A1 | 7/2004 | Gauthier et al. |
| 2004/0153715 A1 | 8/2004 | Spaeth et al. |
| 2004/0220964 A1 | 11/2004 | Shiftan et al. |
| 2005/0021456 A1 | 1/2005 | Steele et al. |
| 2005/0029344 A1 | 2/2005 | Davis |
| 2005/0036611 A1 | 2/2005 | Seaton et al. |
| 2005/0045718 A1 | 3/2005 | Bortolin et al. |
| 2005/0050367 A1 | 3/2005 | Burger et al. |
| 2005/0058427 A1 | 3/2005 | Nguyen et al. |
| 2005/0071225 A1 | 3/2005 | Bortolin et al. |
| 2005/0071226 A1 | 3/2005 | Nguyen et al. |
| 2005/0071227 A1 | 3/2005 | Hammad et al. |
| 2005/0071228 A1 | 3/2005 | Bortolin et al. |
| 2005/0071235 A1 | 3/2005 | Nguyen et al. |
| 2005/0102234 A1 | 5/2005 | Devine |
| 2005/0121506 A1 | 6/2005 | Gauthier et al. |
| 2005/0149455 A1 | 7/2005 | Bruesewitz et al. |
| 2005/0231921 A1 | 10/2005 | Noda et al. |
| 2005/0283416 A1 | 12/2005 | Reid et al. |
| 2005/0283430 A1 | 12/2005 | Reid et al. |
| 2005/0283431 A1 | 12/2005 | Reid et al. |
| 2005/0283432 A1 | 12/2005 | Reid et al. |
| 2005/0283433 A1 | 12/2005 | Reid et al. |
| 2006/0017570 A1 * | 1/2006 | Moskowitz et al. ....... 340/572.7 |
| 2006/0044206 A1 | 3/2006 | Moskowitz et al. |
| 2006/0080243 A1 | 4/2006 | Kemper et al. |
| 2006/0124748 A1 | 6/2006 | Osborn et al. |
| 2006/0155644 A1 | 7/2006 | Reid et al. |
| 2006/0163345 A1 | 7/2006 | Myers et al. |
| 2006/0178957 A1 | 8/2006 | LeClaire |
| 2006/0179007 A1 | 8/2006 | Davis |
| 2006/0187061 A1 * | 8/2006 | Colby ........................ 340/572.8 |
| 2006/0208066 A1 | 9/2006 | Finn et al. |
| 2006/0254815 A1 | 11/2006 | Humphrey et al. |
| 2006/0290501 A1 * | 12/2006 | Hammad et al. ........... 340/572.1 |
| 2006/0293027 A1 | 12/2006 | Hammad et al. |
| 2007/0001000 A1 | 1/2007 | Nguyen et al. |
| 2007/0001001 A1 | 1/2007 | Myers et al. |
| 2007/0005613 A1 | 1/2007 | Singh et al. |
| 2007/0005774 A1 | 1/2007 | Singh et al. |
| 2007/0012764 A1 | 1/2007 | Bortolin et al. |
| 2007/0017970 A1 | 1/2007 | Gauthier et al. |
| 2007/0034679 A1 | 2/2007 | Gauthier et al. |
| 2007/0055597 A1 | 3/2007 | Patel et al. |
| 2007/0055630 A1 | 3/2007 | Gauthier et al. |
| 2007/0057034 A1 | 3/2007 | Gauthier et al. |
| 2007/0057051 A1 | 3/2007 | Bortolin et al. |
| 2007/0083465 A1 | 4/2007 | Ciurea et al. |
| 2007/0100691 A1 | 5/2007 | Patterson |
| 2007/0109130 A1 * | 5/2007 | Edenfield ................... 340/572.8 |
| 2007/0125842 A1 | 6/2007 | Antoo et al. |
| 2009/0069051 A1 | 3/2009 | Jain et al. |
| 2009/0134223 A1 | 5/2009 | Matthews et al. |
| 2010/0219099 A1 | 9/2010 | Schmitt et al. |

FOREIGN PATENT DOCUMENTS

| | | |
|---|---|---|
| EP | 1 313 027 | 5/2003 |
| EP | 1503448 A1 | 2/2005 |
| EP | 1 542 429 | 6/2005 |
| EP | 1764860 A1 | 3/2007 |
| GB | 2238344 | 5/1991 |
| JP | 4-64176 U | 6/1992 |
| JP | 4-347697 A | 12/1992 |
| JP | 5-72330 A | 3/1993 |
| JP | 5-254284 A | 10/1993 |
| JP | 10-187917 A | 7/1998 |
| JP | 11-75329 A | 3/1999 |
| JP | 11-184993 A | 7/1999 |
| JP | 2000-187715 A | 7/2000 |
| JP | 2002/092564 | 3/2002 |
| JP | 2003-324765 A | 11/2003 |
| JP | 3113025 U | 7/2005 |
| JP | 2005-293191 A | 10/2005 |
| JP | 2006-31232 A | 2/2006 |
| JP | 2006-268883 A | 10/2006 |
| JP | 2006-313482 A | 11/2006 |
| JP | 2007-108982 A | 4/2007 |
| JP | 2007-511682 A | 5/2007 |
| WO | 2006/005984 A1 | 1/2006 |

OTHER PUBLICATIONS

Office Action for U.S. Appl. No. 12/332,990 dated Dec. 2, 2010, 12 pages.
International Search Report mailed on Oct. 30, 2008 for PCT Patent Application No. PCT/US2008/065081, 2 pages.
Chinese Office Action mailed on Mar. 5, 2012 for Chinese Patent Application No. 200880024860.1, with English Translation, 20 pages.
Japanese Office Action mailed on Oct. 19, 2012 for Japanese Patent Application No. 2010-512251, with English Translations, 9 pages.
European Communication mailed on Feb. 22, 2013 for EP Patent Application No. 08769787.6, 5 pages.
European Search Report mailed on Nov. 4, 2011 for European Patent Application No. 08769787.6, 6 pages.
Chinese Office Action mailed on Jan. 6, 2013 for Chinese Patent Application No. 200880024860.1, with English Translation, 27 pages.
Japanese Office Action mailed on May 21, 2013 for Japanese Patent Application No. 2010-512251, with English Translations, 5 pages.

* cited by examiner

SHIELDING OF PORTABLE CONSUMER DEVICE

BACKGROUND

Embodiments of the present invention relate to systems and methods for preventing portable consumer devices such as contactless smart cards from being wireless interrogated.

Generally, contactless portable consumer devices such as smart cards, key fobs, radio frequency identification devices (RFID), cellular phones, etc. are designed to provide the consumer with a way to engage in wireless communication using radio frequency (RF) signals.

Because contactless portable consumer devices can operate without wires, such devices are expected to replace other types of devices that require physical contact or physical connections to communicate with other devices and systems. A major benefit of contactless portable consumer devices is that they do not have to be removed from a consumer's wallet, briefcase, backpack, or purse to be used.

Unfortunately, due to the wireless nature of the contactless portable consumer devices, it is entirely possible that a contactless reader may be used for surreptitious interrogation (e.g., data skimming) of the contactless devices.

As theft of sensitive information using wireless interrogation of contactless devices is a major concern for consumers and businesses alike, law enforcement agencies are actively seeking ways to discover when such activity is taking place. Unfortunately, given the sophistication of the wireless interrogation equipment and the nature of wireless signals, unauthorized wireless interrogation can occur.

Embodiments of the invention address these and other embodiments individually and collectively.

BRIEF SUMMARY

Embodiments of the invention prevent a contactless portable consumer device such as a smartcard, RFID, key fob, tag, and the like from being wireless interrogated by an unauthorized interrogation device.

In one aspect, an embodiment of the present invention relates to a portable consumer device configured to enable wireless communication with an interrogation device. The portable consumer device includes a memory for storing information such as financial information, an antenna (e.g., a transmitting antenna) such as a near field transmitting antenna coupled to the memory, and a shield that is movable between a distal (e.g., open) position and a proximate (e.g., closed) position. In the distal position, the shield allows wireless interrogation of the memory via the antenna. In the proximate position, the shield will prevent wireless interrogation of the memory via the antenna. In another aspect, an embodiment of the present invention relates to a method of forming the portable consumer devices of the present invention.

In another aspect, an embodiment of the present invention relates to a system that includes an interrogation device and a portable consumer device. The portable consumer device includes a memory for storing information, an antenna (e.g., a transmitting antenna) coupled to the memory, and an electromagnetic shield. The antenna is capable of communicating with the interrogation device when the portable consumer device is placed near the interrogation device if the shield is distal to the antenna. Communication between the portable consumer device and the interrogation device is prevented when the shield is proximate to the antenna. When the shield is proximate to the antenna, it can block or absorb electromagnetic interrogation signals from the interrogation device or otherwise load, mismatch, or de-tune the antenna to inhibit reception of interrogation signals or transmission of data signals. The shield may prevent or otherwise inhibit interrogation via the antenna if the shield is between the antenna and the interrogation device or if the antenna is between the interrogation device and the shield.

In another aspect, an embodiment of the invention relates to a method of providing secure wireless communication with an interrogation device. A portable consumer device is provided that includes a memory for storing information, a antenna coupled to the memory, and an electromagnetic shield. A consumer is allowed to place the portable consumer device proximate to the interrogation device. The portable consumer device is capable of communicating with the interrogation device only when the shield is in a distal position.

These and other embodiments of the invention are described in further detail below.

DETAILED DESCRIPTION

Figure 1:
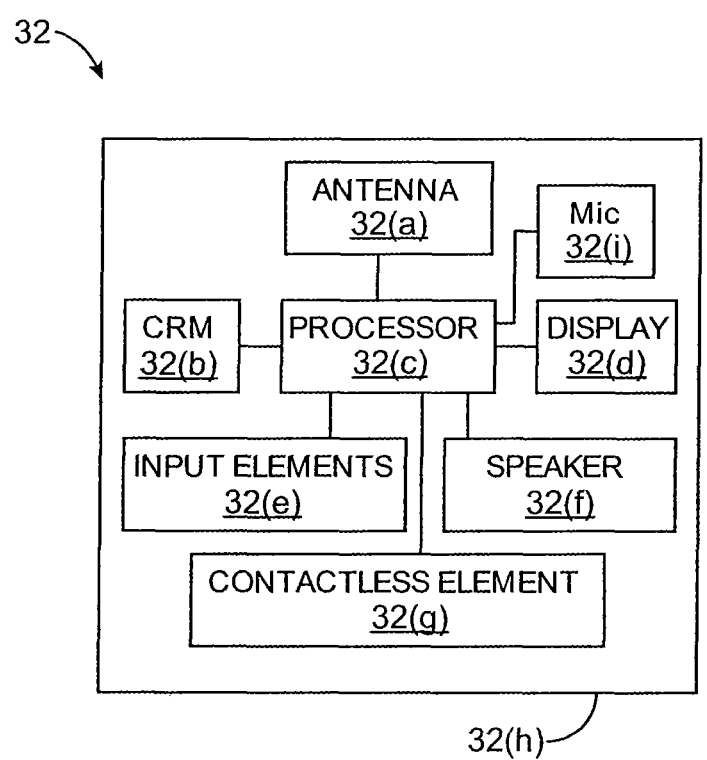
FIG. 1 shows a block diagram of a contactless portable consumer device.

Embodiments of the present invention allow for secure wireless communication between a portable consumer device that includes stored information and an interrogation device. A consumer or other type of user can choose whether or not he or she wants allow an interrogation device to interrogate the portable consumer device. In embodiments of the invention, a shield that blocks, absorbs, attenuates, or otherwise inhibits coupling of electromagnetic radiation may be movably coupled to a base portion of the portable consumer device that includes at least an antenna. The shield controls whether the device can be interrogated for its stored information. To enable interrogation of the portable consumer device, a user such as a consumer may be required to move the shield to a distal (e.g., an open position). If the shield is in a proximate (e.g., closed position), the portable consumer device cannot be interrogated with an interrogation device. Stated differently, when a majority of the shield is closer to the antenna, it cannot be interrogated by the interrogation device. When the shield is farther from the antenna, it can be interrogated by the interrogation device. Many of the specific examples described below refer to the shield being in an "open" or "closed" position, but are not limited thereto. For example, in a distal position, the shield may cover less of the lateral area of the antenna, while in the proximate position, the shield may be moved to cover more of the antenna. In the distal position, the memory can be interrogated via the antenna. In the proximate position, the memory cannot be interrogated via the antenna.

In embodiments of the invention, a movable element (such as a hinge, rails, etc.) can allow the shield which may be disposed in a shield portion and a base portion which may comprise the antenna to move relative to each other. The shield portion and the base portion may slide relative to each other, or may rotate relative to each other.

The shield may prevent interrogation of the memory via the antenna in any suitable manner. In some cases, when it is in a proximate (e.g., closed) position, the shield may be between the interrogation device and the antenna. In other cases, when it is in a proximate position, the antenna may be between the shield and the interrogation device. In both cases, the antenna is configured to absorb or reflect radiation from the interrogation device. The shield can absorb interrogation signals from the interrogation device, and can effectively ground such signals so that they do not reach the antenna, thus preventing interrogation of the memory via the antenna. In this regard, if the portable consumer device is a cell phone or other type of portable electronic device, the shield may optionally be coupled to a metal chassis or other grounding point in the portable consumer device. As will be explained in further detail below, in preferred embodiments, the lateral area of the shield may be larger than the lateral area of antenna to provide for this grounding effect.

The shield may, but is not required to be coupled to a ground or voltage common reference within the portable consumer device. In some embodiments, the shield may be electrically floating relative to the antenna ground potential. In yet other embodiments, the shield may include multiple elements, and some portions may be coupled to distinct voltage potentials, including ground or voltage common, while other portions are floating.

In other embodiments, the shield may operate to load the antenna or otherwise de-tune the response of the antenna to the interrogation signal. For example, the shield may, when positioned proximate the antenna, reduce the gain of the antenna in the frequency band of the interrogation signal. The antenna may then couple a substantially reduced interrogation signal to the portable consumer device such that the portable consumer device does not respond to the interrogation signal. In another embodiment, the shield may, when positioned proximate the antenna, create an impedance mismatch between the antenna and the signal processing portion of the portable consumer device. The impedance mismatch can substantially reduce the power of the interrogation signal that is coupled to the signal processing portions and can substantially reduce any signals generated in the signal processing portions from being transmitted to an interrogation device.

The portable consumer devices according to embodiments of the present invention are capable of wireless or contactless communication with an interrogation device. They may include one or more antennas that transmit and receive signals and data through a wireless or contactless communication medium.

An exemplary portable consumer device and an exemplary interrogation device preferably communicate using a Near Field Communication or NFC technology. NFC technology utilizes a very short range (e.g., usually less than 10 inches) two-way wireless connectivity, and is a short-range radio frequency (RF) technology that allows an interrogation device such as a reader to read small amounts of data when the portable consumer device is near the interrogation device.

A portable consumer device using NFC technology uses electromagnetic induction to cause the portable consumer device to transmit information stored in it. A typical portable consumer device using a typical NFC technology contains at least a small processor and a transmitting antenna which is typically in the form of a wire loop. When the portable consumer device is close to an interrogation device with an interrogation signal (e.g., an RF signal) such as an electromagnetic field, the wire loop enters the terminal's field, causing induction in the wire loop. The voltage generated by the induction powers the processor. Once the portable consumer device is activated, the processor then transmits information stored in the memory in the portable consumer device and communicates with the terminal at a predetermined frequency (e.g., 13.56 MHz) using the wire loop. Instruction sets built into the processor may also encrypt the data during transmission.

This above-described process is referred to as inductive coupling and the portable consumer device may be characterized as "batteryless" as no internal source of power is required to power the processor. This type of system can be characterized as a passive system since active powering of the processor is not present. Alternatively, portable consumer devices of the present invention may include an internal source of power, such as a battery, to enable active operation of a transmitting antenna that transmits the stored information to an interrogation device.

The portable consumer devices according to some embodiments of the present invention include an electromagnetic shield that is movable between a closed position and an open position. The closed shield prevents electromagnetic radiation, such as an interrogation signal, from reaching a receiving or base portion of the device (e.g., the portion having the induction wire loop). (The base portion may comprise a housing and the antenna.) The closed shield further prevents electromagnetic radiation, such as a signal carrying the information stored on the processor, from being transmitted by the antenna of the device to the interrogation device. In the open position, the shield does not impede communication between the portable consumer device and the interrogation device.

In some embodiments, the shield may also act as a blocking mechanism. The electromagnetic shield can limit or block the flow of electromagnetic fields between two locations, by separating them with a barrier made of conductive material, such as a metal. Typically, a shield is used to separate electrical devices from the other devices that generate an electromagnetic field. Electromagnetic shielding used to block radio frequency electromagnetic radiation is also known as RF shielding. The shield can reduce the coupling of radio waves, electromagnetic fields and electrostatic fields. The amount of reduction depends upon the material used, its thickness, and the frequency of the fields of interest. In other cases, the shield can be characterized as a radiation absorber, and may not physically shield the antenna from the interrogation device (i.e., is not disposed between the antenna and the interrogation device). In other embodiments, the shield operates as an electronic tuning element and de-tunes the antenna or otherwise desensitizes the antenna to the interrogation signal or to the frequency band of the interrogation signal.

Typical materials used for electromagnetic shielding include sheet metal and metal mesh. Any holes in the shield or mesh are typically significantly smaller than the wavelength of the radiation that is being blocked, or the enclosure will not effectively approximate an unbroken conducting surface. Another commonly used shielding method, especially with electronic goods housed in plastic enclosures, is to coat the inside of the enclosure with a metallic ink or similar material. The ink consists of a carrier material loaded with a suitable metal, typically copper or nickel, in the form of very small particulates. It is sprayed on to the enclosure and, once dry, produces a continuous conductive layer of metal, which can be electrically connected to the chassis ground of the equipment, thus providing effective shielding.

The portable consumer devices of the present invention may be of any suitable form. For example, the portable consumer devices may be hand-held and compact so that they can fit into a consumer's wallet or pocket (e.g., pocket-sized). They may be used for the payment for goods or services, money transfers, or gaining access to places (e.g., access badges). The portable consumer devices may include smartcards, ordinary credit or debit cards (with a magnetic strip and without a microprocessor), keychain devices (such as the Speedpass device commercially available from Exxon-Mobil Corp.), key fobs, cellular phones, personal digital assistants (PDAs), pagers, payment cards, security cards, access cards, smart media, transponders, and the like.

The portable consumer device may comprise a computer readable medium and a body as shown in FIG. 1. (FIG. 1 shows a number of components, and the portable consumer devices according to embodiments of the invention may comprise any suitable combination or subset of such components.) The computer readable medium 32(b) may be present within the body 32(h), or may be detachable from it. The body 32(h) may be in the form a plastic substrate, housing, or other structure. The computer readable medium 32(b) may be a memory that stores data and may be in any suitable form including a magnetic stripe, a memory chip, etc. The memory preferably stores information such as financial information, transit information (e.g., as in a subway or train pass), access information (e.g., as in access badges), etc. Financial information may include information such as bank account information, bank identification number (BIN), credit or debit card number information, account balance information, expiration date, consumer information such as name, date of birth, etc. Any of this information may be transmitted by the portable consumer device.

Information in the memory may also be in the form of data tracks that are traditionally associated with credits cards. Such tracks include Track 1 and Track 2. Track 1 ("International Air Transport Association") stores more information than Track 2, and contains the cardholder's name as well as account number and other discretionary data. This track is sometimes used by the airlines when securing reservations with a credit card. Track 2 ("American Banking Association") is currently most commonly used. This is the track that is read by ATMs and credit card checkers. The ABA (American Banking Association) designed the specifications of this track and all world banks must abide by it. It contains the cardholder's account, encrypted PIN, plus other discretionary data.

The portable consumer device 32 may further include a contactless element 32(g), which is typically implemented in the form of a semiconductor chip (or other data storage element) with an associated wireless transfer (e.g., data transmission) element, such as an antenna. Contactless element 32(g) is associated with (e.g., embedded within) portable consumer device 32 and data or control instructions transmitted via a cellular network may be applied to contactless element 32(g) by means of a contactless element interface (not shown). The contactless element interface functions to permit the exchange of data and/or control instructions between the mobile device circuitry (and hence the cellular network) and an optional contactless element 32(g).

Contactless element 32(g) is capable of transferring and receiving data using a near field communications ("NFC") capability (or near field communications medium) typically in accordance with a standardized protocol or data transfer mechanism (e.g., ISO 14443/NFC). Near field communications capability is a short-range communications capability, such as RFID, Bluetooth™, infra-red, or other data transfer capability that can be used to exchange data between the portable consumer device 32 and an interrogation device. Thus, the portable consumer device 32 is capable of communicating and transferring data and/or control instructions via both cellular network and near field communications capability.

The portable consumer device 32 may also include a processor 32(c) (e.g., a microprocessor) for processing the functions of the portable consumer device 32 and a display 32(d) to allow a consumer to see phone numbers and other information and messages. The portable consumer device 32 may further include input elements 32(e) to allow a consumer to input information into the device, a speaker 32(f) to allow the consumer to hear voice communication, music, etc., and a microphone 32(i) to allow the consumer to transmit her voice through the portable consumer device 32. The portable consumer device 32 may also include an antenna 32(a) for wireless data transfer (e.g., data transmission). The antenna 32(a) can be used to couple the wireless interrogation to the portable consumer device 32 as well as transmit a wireless signal from the portable consumer device 32 back to the interrogation device or some other device reader.

The antenna 32(a) can be coupled to the processor 32(c) and other elements within the portable consumer device directly or via an RF front end (not shown). The RF front end can be configured, for example, to provide the air interface between the portable consumer device 32 and remote devices. For example, the RF front end may be configured to receive an interrogation signal at RF and filter, downconvert, and demodulate the interrogation signal for further signal processing. Conversely, the RF front end can be configured to receive a data transmission signal from the processor 32(c) and modulate and upconvert the signal or otherwise format the data transmission signal for wireless transmission.

The portable consumer device 32 may also include one or more power sources or power supplies (not shown). In an embodiment where the portable consumer device is a passive device, a power supply may be coupled to the antenna 32(a) and can be configured to generate power from the interrogation signal received via the antenna 32(a). In other embodiments, a power supply may be coupled to a battery or some other power source and may generate the power for the various elements of the portable consumer device 32 from the power source.

If the portable consumer device is in the form of a debit, credit, or smartcard, the portable consumer device may also optionally have features such as magnetic strips. Such devices can operate in either a contact or contactless mode.

The portable consumer device of the present invention may be used with authorized interrogation devices (e.g., authorized readers) that may also have antennas and signal generators. Such authorized interrogation devices may be present at point of sale (POS) terminals, ATM (automatic teller machines), and the like. Such interrogation devices may be used to wirelessly read information stored on the portable consumer device memory or to write information onto the same.

Figure 2:
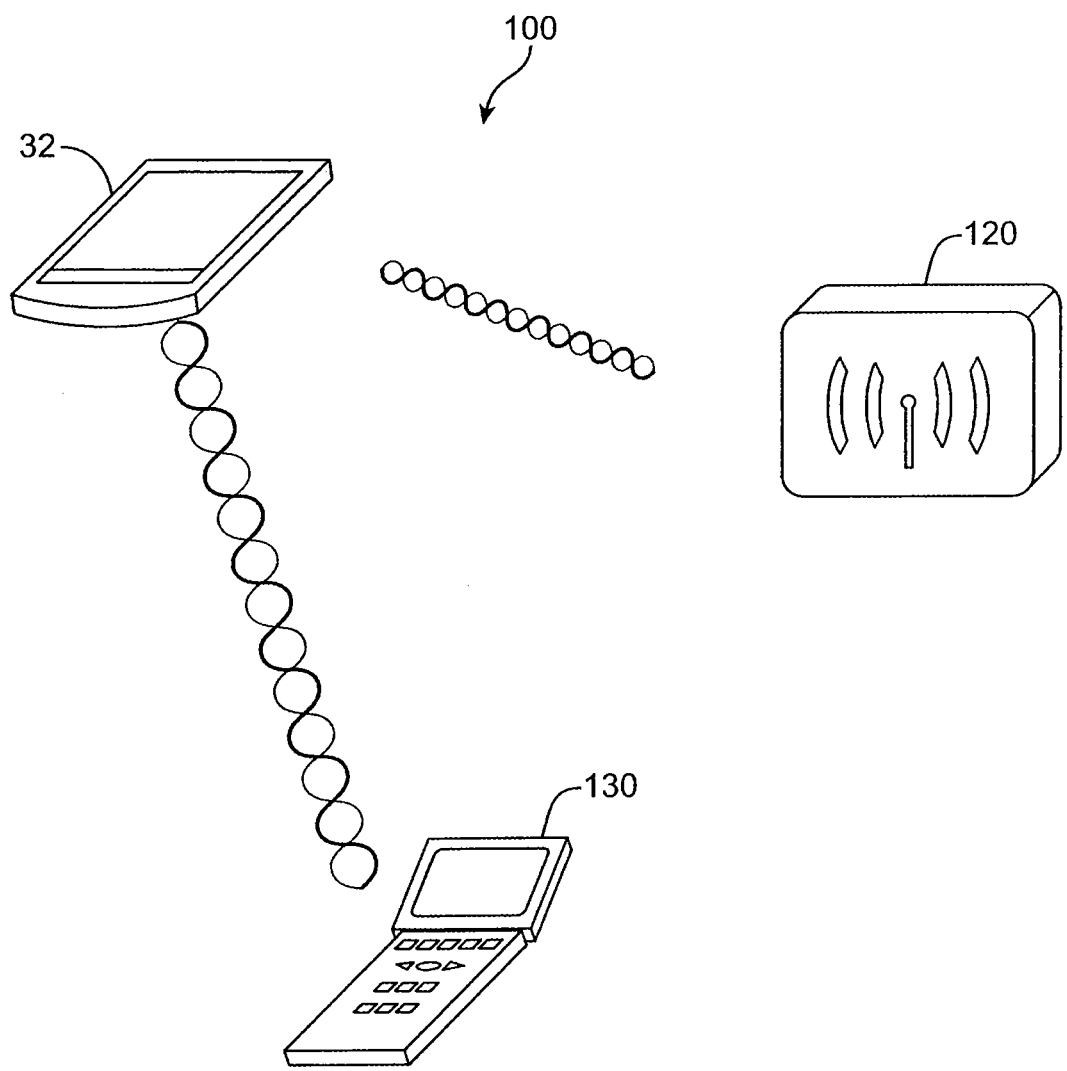
FIG. 2 shows a system that illustrates the security risks of contactless portable consumer devices.

FIG. 2 shows a wireless communication system 100 that illustrates the security issues currently associated with contactless portable consumer devices. In particular, portable consumer device 32 may be interrogated by an authorized interrogation device 120. However, it can also unfortunately be interrogated by the unauthorized interrogation device 130. There is a need to prevent interrogation of portable consumer devices with unauthorized interrogation devices.

Figure 3:
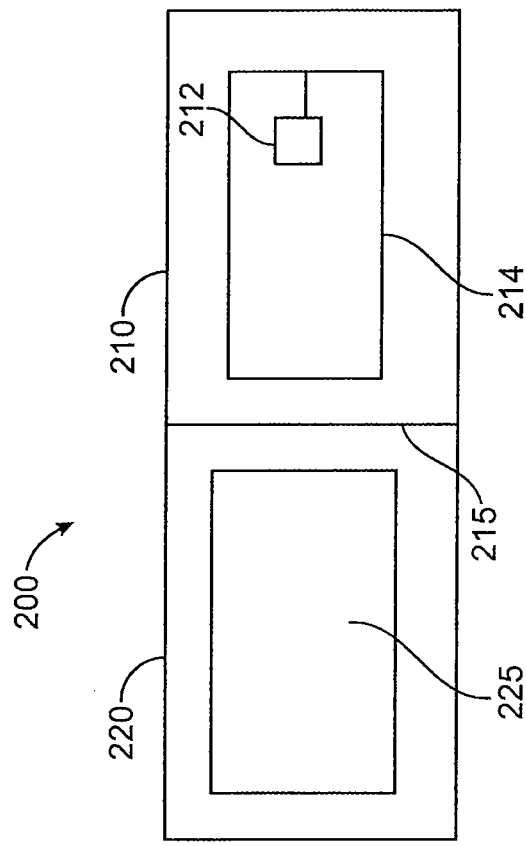
FIG. 3 shows a schematic diagram of a system in accordance with an embodiment of the present invention including one embodiment of a contactless portable consumer device having the shield in an open or distal position.
Figure 3:
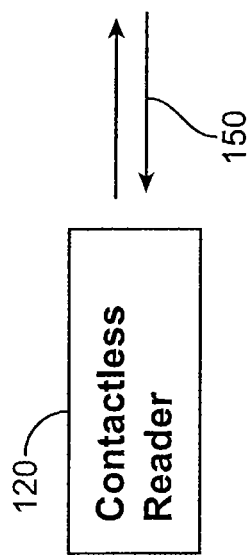

FIG. 3 is a schematic representation of a contactless portable consumer device 200 in accordance with one embodiment of the present invention. A base portion 210 of portable consumer device 200 includes a housing, a processor 212 (e.g., a microprocessor and a memory storing financial information) and a transmitting antenna 214. If a housing is present, the housing can simply be flat body with or without laminated sheets, or may be a molded plastic body. In embodiments of the invention, the transmitting antenna 214 may transmit electromagnetic signals to an interrogation device (e.g., contactless reader 120), and it may also receive electromagnetic interrogation signals from the interrogation device. Shield portion 220 of portable consumer device 200 includes an electromagnetic shield 225, which may be formed of a sheet of metal, metal mesh, or a coat of metallic ink, or other suitable electromagnetic shielding material. It is preferred that shield 225 is capable of shielding RF electromagnetic signals or otherwise attenuating or inhibiting the receipt and transmission of signals. For example, the shield 225, when positioned proximate the antenna 214, may operate to electronically load, mismatch, or otherwise de-tune the antenna 214, such that the antenna 214 couples a substantially attenuated version of the interrogation signal to the portable consumer device 200 relative to the case when the shield 225 is positioned distal to the antenna 214.

FIG. 3 shows shield 225 in an open position about hinge 215, in which the portable consumer device 200 is capable of communicating with contactless reader 120 via communication link 150 to transmit the information stored in processor 212. For example, in a passive mode, contactless reader 120 may emit an electromagnetic interrogation field that, when coupled with movement of device 200 through the field, induces current in transmitting antenna 214 for reading processor 212 and transmitting a return signal containing the information stored within processor 212. In an active mode, a power source (not shown) of the portable consumer device 200 may power processor 212 and antenna 214 to transmit a signal to contactless reader 120 containing the stored information.

Figure 4:
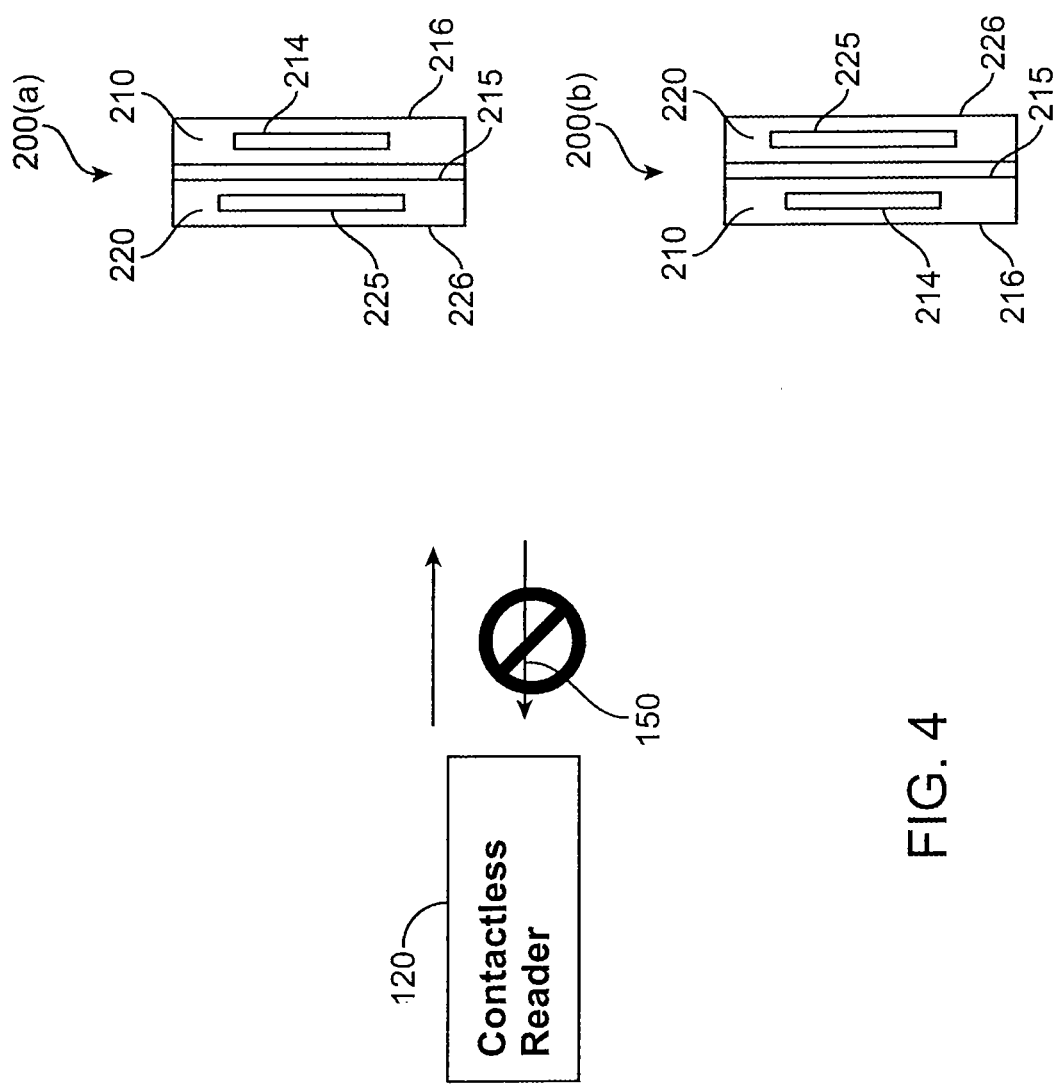
FIG. 4 shows the schematic diagram of FIG. 3 with the shield of the contactless portable consumer device in a closed or proximate position.

FIG. 4 shows portable consumer device 200(a) when shield 225 is in a closed position, having swung closed about hinge 215, rendering the device incapable of communicating with contactless reader 120. Communication link 150 is broken when front face 226 of the device is disposed toward the contactless reader 120 because shield 225 is disposed between transmitting antenna 214 and the contactless reader 120. It should be understood that communication link 150 remains broken when rear face 216 of the device is disposed toward contactless reader 120 because base portion 210 is also electromagnetically shielded. For example, in some embodiments where processor 212 and antenna 214 are disposed on a semi-conductor chip, rear face 216 can be electromagnetically shielded by a backing material of the chip. A metal sheet/mesh or metallic coating on a plastic body panel of base portion 210 can also be used to provide shielding.

Shield 225 may be about the same size as or slightly larger than the transmitting antenna 214 and may entirely cover the antenna 214 when it is in the closed position. Alternatively, shield 225 may be sized to substantially cover the entire surface of shield portion 220. Shield 225 is to be formed of a material and in a size that effectively blocks transmitting antenna 214 from transmitting or receiving electromagnetic signals when the shield is in the closed position. Hinge 215 may be configured so as to be bias the shield portion 220 in a closed position and may also enable the shield portion 220 to be held in the open position.

Also, as shown by another configuration of the portable consumer device 200(b), the antenna 214 may be disposed between the contactless reader 120 and the antenna 225. The region between the antenna 225 and the reader 120 may be free of a shield. The shield 225 may be larger than the antenna 214 (or may be otherwise configured to achieve the same result), so that the shield can act as a ground effectively preventing interrogation via the antenna 214. Thus, as shown in FIG. 4, interrogation of the portable consumer device via the antenna 214 can be prevented, regardless of the orientation of the portable consumer device.

Figure 5B:
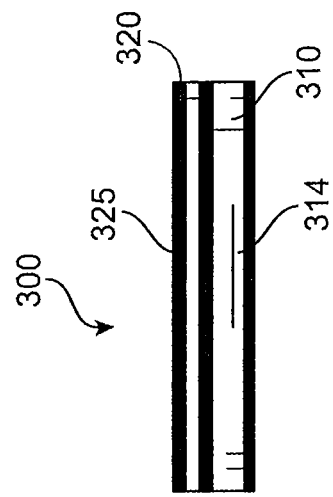
FIGS. 5A and 5B show a key fob embodiment of a contactless portable consumer device in accordance with the present invention.
Figure 5A:
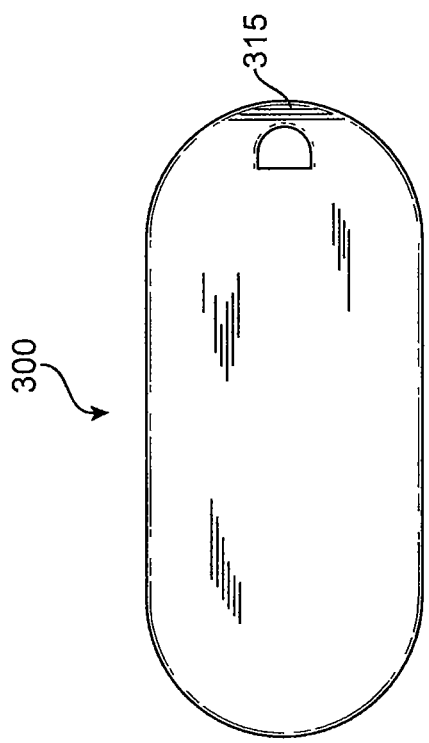

FIGS. 5A and 5B show a portable consumer device 300 in accordance with another embodiment of the present invention in which the portable consumer device is implemented as a hinged key fob. Key fob 300 includes a hinge 315 about which the body portions 310 and 320 can be rotated to open or close the key fob. Base portion 310 includes a processor (not shown) and transmitting antenna 314 as previously described. Shield portion 320 includes or constitutes an electromagnetic shield 325 as previously described for blocking electromagnetic radiation from reaching antenna 314.

Figure 6:
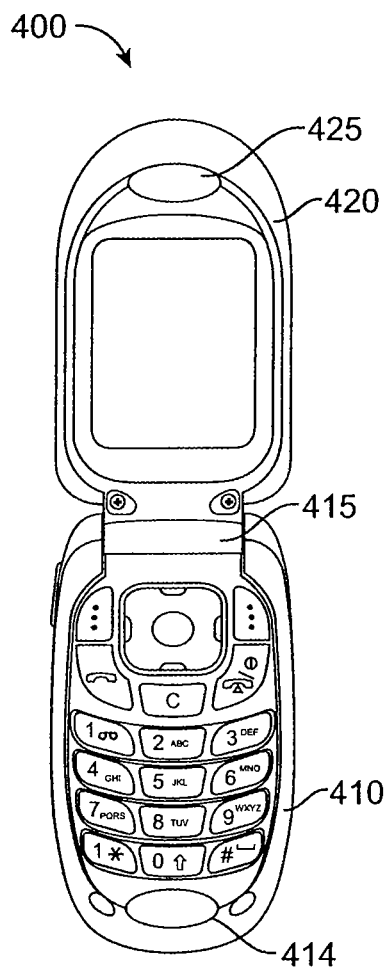
FIG. 6 shows a flip-style cell phone embodiment of a contactless portable consumer device in accordance with the present invention.

FIG. 6 shows portable consumer device 400 in accordance with another embodiment of the present invention in which the portable consumer device is implemented as a flip-style cell phone. Transmitting antenna 414 may be disposed on a base portion 410 of the cell phone 400 and shield 425 may be disposed on a display portion 420 of the cell phone such that when the portions 410 and 420 are closed about hinge 415, the shield 225 effectively blocks antenna 414 from communicating with an interrogation device (not shown).

Figure 7:
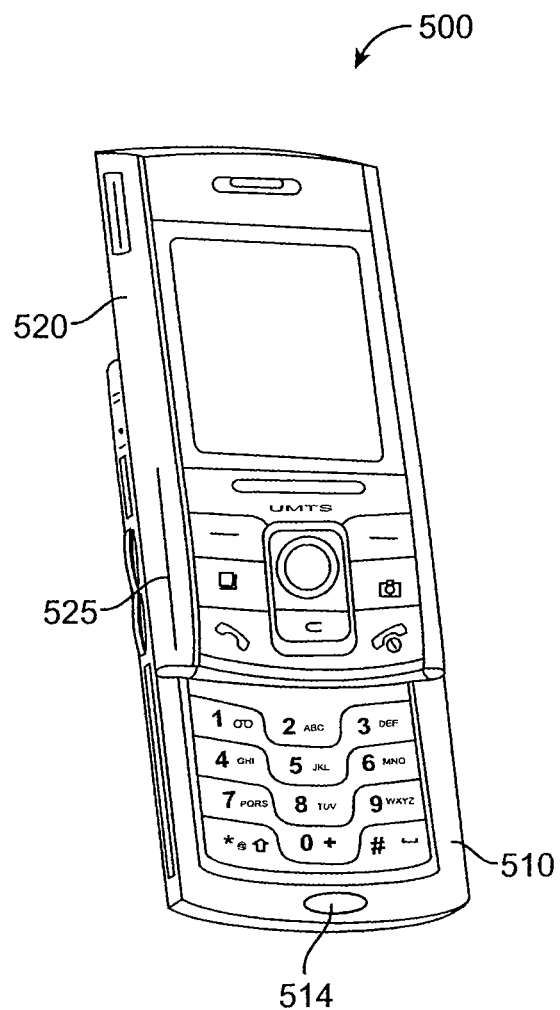
FIG. 7 shows a sliding-style cell phone embodiment of a contactless portable consumer device in accordance with the present invention.

FIG. 7 shows portable consumer device 500 in accordance with another embodiment of the present invention in which the portable consumer device is implemented as a sliding-style cell phone. Transmitting antenna 514 may be disposed on a base portion 510 of the cell phone 500 and shield 525 may be disposed within sliding display portion 520 of the cell phone such that when the portion 520 is slid closed over base 520, the shield 225 effectively blocks antenna 514 from communicating with an interrogation device (not shown).

It should be understood that any suitable arrangement may be used to move the electromagnetic shield over a transmitting or receiving portion of the portable consumer device to prevent the device from communicating with an interrogation device.

Figure 8:
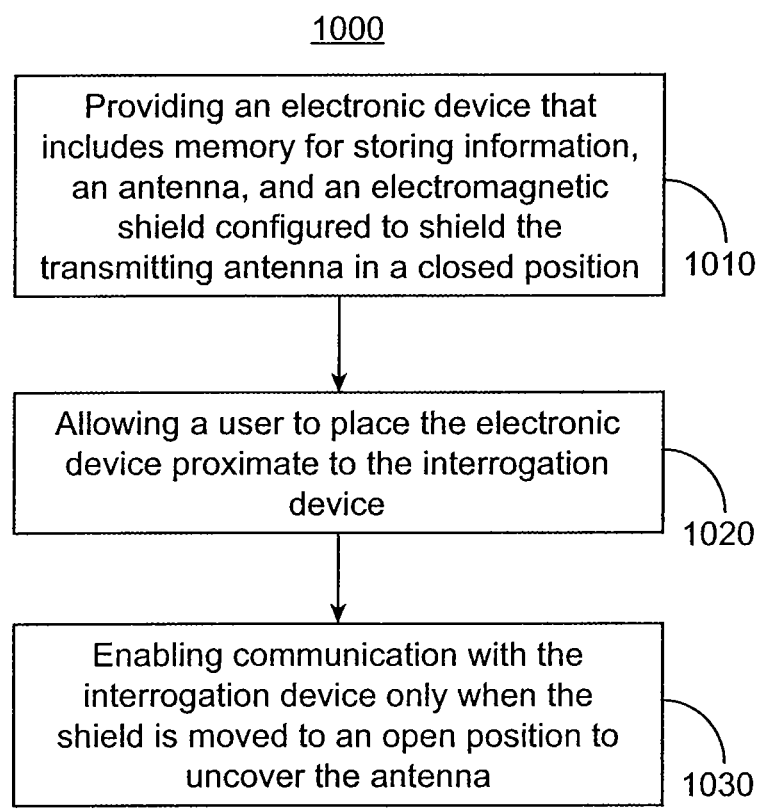
FIG. 8 is a flow diagram illustrating a method in accordance with the present invention.

FIG. 8 is a flow diagram illustrating a method 1000 for providing secure wireless communication with an interrogation device. The method may be entered into at step 1010, at which an portable consumer device is provided that includes a memory for storing information, an antenna, and an electromagnetic shield configured to shield the antenna in a closed position. For example, a credit card issuer may provide a consumer with a portable consumer device configured for secure contactless communication. At step 1020, a consumer is allowed to place the portable consumer device proximate to the interrogation device. For example, a consumer may be allowed to place the portable consumer device proximate to an authorized interrogation device at a POS terminal, which may emit an interrogation signal for powering and communicating with the device. At step 1030, the portable consumer device is only able to communicate with the interrogation device when the shield is moved to an open position to uncover the antenna. For example, the consumer may flip the shield about a hinge to uncover the antenna.

The above-described portable consumer devices may be made using any suitable method. In one method, a portable consumer device can be made by first forming an antenna on a substrate. A memory may be coupled to the antenna. The memory may be present in the form of one or more chips which may be mounted (using standard chip mounting processes) on the substrate, so that the one or more chips are electrically coupled to the antenna. The substrate may be an insulating plastic substrate like those typically used in a payment card such as a credit card. Metal patterns can be formed on the substrate using conventional circuit printing processes. An electromagnetic shield material may be added to the substrate to prevent communication between the interrogation device and the antenna through the substrate. The movable shield may be attached to the substrate with a suitable mechanism, such as a hinge, for enabling the shield to be moved from a closed position covering the antenna and an open position that enables communication with the interrogation device.

Embodiments of the invention have a number of advantages. When a consumer opens the shield of the portable consumer device to expose the transmitting portion, the consumer makes a conscious decision to allow the portable consumer device to be interrogated. The portable consumer device cannot be successfully interrogated when the shield is in its default, closed position. Accordingly, information in the portable consumer device can be retrieved when the consumer wants it to be transmitted, but cannot be retrieved when the consumer does not want the information to be transmitted. In addition, embodiments of the invention are relatively easy to manufacture. Also, embodiments of the invention are relatively inexpensive to manufacture and are effective in preventing unauthorized interrogation of a portable consumer device. Further, embodiments of the invention are simple to use, making it more likely that a consumer will use it. Fourth, embodiments of the invention can prevent wireless interrogation, regardless of the orientation of the portable consumer device. Embodiments of the invention may satisfy all or any suitable combination of such advantages.

It is apparent to one skilled in the art that various changes and modifications can be made to this disclosure, and equivalents employed, without departing from the spirit and scope of the invention. Elements shown with any embodiment are exemplary for the specific embodiment and can be used on other embodiments within this disclosure.

What is claimed is:

1. A portable consumer device comprising:
   a memory for storing information including credit or debit card information, wherein the information is in the form of Track 1 or Track 2 data;
   a processor coupled to the memory;
   a first antenna coupled to the processor;
   a second antenna coupled to the processor and associated with a base portion of the portable consumer device, and configured to communicate with an interrogation device using short range RF communication;
   a shield portion comprising a shield coupled to the base portion, the shield comprising conductive material, wherein the shield is configured to electronically load the second antenna such that the second antenna couples a substantially attenuated version of an interrogation signal to the portable consumer device;
   a movable element coupling the base portion and the shield portion and capable of moving the shield portion between a proximate position and a distal position and wherein the shield is configured to cover only a portion of the second antenna when the shield is in the proximate position, and wherein the movable element is configured to bias the shield portion to be in the proximate position;
   a display coupled to the processor;
   a microphone coupled to the processor; and
   a speaker coupled to the processor;
   wherein the portable consumer device is a phone.

2. The device of claim 1 wherein the shield in the proximate position is configured to prevent communication between the interrogation device and the second antenna when the portion of the second antenna is between the interrogation device and the shield.

3. The device of claim 1 wherein the portable consumer device is capable of being interrogated by the interrogation signal generated by the interrogation device when the shield is in the distal position.

4. The device of claim 1 wherein the second antenna generates power from the received interrogation signal.

5. The device of claim 4 wherein the interrogation signal comprises data to be stored in the memory.

6. The device of claim 1, wherein the second antenna is a near field antenna.

7. The device of claim 1, wherein the second antenna is coupled to a power source disposed within the portable consumer device.

8. A system comprising:
   an interrogation device; and
   the portable consumer device of claim 1 in communication with the interrogation device.

9. A method of using the portable consumer device of claim 1, the method comprising:
   moving the shield into the distal position; and
   placing the portable consumer device near the interrogation device.

10. The method of claim 9 wherein the portable consumer device is placed within about 10 inches or less of the interrogation device.

11. The portable consumer device of claim 1 wherein the shield is electronically floating relative to a ground potential of the second antenna.

12. The portable consumer device of claim 1 wherein the second antenna is configured to communicate with an external terminal at a frequency of about 13.56 MHz.

* * * * *

UNITED STATES PATENT AND TRADEMARK OFFICE
CERTIFICATE OF CORRECTION

| | | |
|---|---|---|
| PATENT NO. | : 8,604,995 B2 | Page 1 of 1 |
| APPLICATION NO. | : 11/811875 | |
| DATED | : December 10, 2013 | |
| INVENTOR(S) | : Hammad | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 645 days.

Signed and Sealed this
Twenty-sixth Day of May, 2015

Michelle K. Lee
*Director of the United States Patent and Trademark Office*